US009698202B2

(12) United States Patent
Takaki

(10) Patent No.: US 9,698,202 B2
(45) Date of Patent: Jul. 4, 2017

(54) PARALLEL BIT LINE THREE-DIMENSIONAL RESISTIVE RANDOM ACCESS MEMORY

(71) Applicant: SANDISK 3D LLC, Milpitas, CA (US)

(72) Inventor: Seje Takaki, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/635,419

(22) Filed: Mar. 2, 2015

(65) Prior Publication Data

US 2016/0260775 A1   Sep. 8, 2016

(51) Int. Cl.
  H01L 27/24 (2006.01)
  G11C 13/00 (2006.01)
  H01L 45/00 (2006.01)

(52) U.S. Cl.
  CPC ........ H01L 27/249 (2013.01); G11C 13/0007 (2013.01); G11C 13/0069 (2013.01);
  (Continued)

(58) Field of Classification Search
  CPC ............... H01L 27/249; H01L 27/2481; H01L 27/2454; H01L 45/141; H01L 45/145;
  (Continued)

(56) References Cited

U.S. PATENT DOCUMENTS 5,915,167 A   6/1999   Leedy
7,005,350 B2  2/2006   Walker et al.
(Continued)

FOREIGN PATENT DOCUMENTS

EP   2608210 A1   6/2013
KR   2010-0109745 A   10/2010
(Continued)

OTHER PUBLICATIONS

Invitation to Pay Additional Search Fees issued in PCT Application No. PCT/US13/41410, mailed Sep. 9, 2013.(6 pp.).
(Continued)

*Primary Examiner* — Vu Le
*Assistant Examiner* — Sung Cho
(74) *Attorney, Agent, or Firm* — The Marbury Law Group PLLC

(57) ABSTRACT

Resistive random access memory (ReRAM) array includes line stack structures located over a substrate. The line stack structures are laterally spaced apart along a first horizontal direction, and extend along a second horizontal direction that is different from the first horizontal direction. Each line stack structure comprises an alternating plurality of word lines and bit lines. An intervening line stack including a memory material line structure, an intrinsic semiconductor material line structure, and a doped semiconductor material line structure is located between each vertically neighboring pair of a word line and a bit line within the alternating plurality of word lines and bit lines. A two-dimensional array of vertical selector lines functions as gate electrodes that activates a semiconductor channel between a word line and a bit line. Resistance of the memory material line structure contacting the activated semiconductor channel can be programmed and/or measured within the ReRAM array.

44 Claims, 11 Drawing Sheets

(52) U.S. Cl.
CPC ...... *G11C 13/0097* (2013.01); *H01L 27/2454* (2013.01); *H01L 27/2481* (2013.01); *H01L 45/1233* (2013.01); *H01L 45/141* (2013.01); *H01L 45/145* (2013.01); *H01L 45/1608* (2013.01); *H01L 45/04* (2013.01); *H01L 45/06* (2013.01); *H01L 45/08* (2013.01); *H01L 45/146* (2013.01); *H01L 45/16* (2013.01)

(58) Field of Classification Search
CPC ..... H01L 45/1608; H01L 45/04; H01L 45/06; H01L 45/08; H01L 45/146; H01L 45/16; G11C 13/0007; G11C 13/0069; G11C 13/0097
USPC ...................... 365/51, 148; 257/74, 278, 288
See application file for complete search history.

(56) References Cited

U.S. PATENT DOCUMENTS

| | | | |
|---|---|---|---|
| 7,023,739 | B2 | 4/2006 | Chen et al. |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,408,212 | B1* | 8/2008 | Luan ................... G11C 13/0007 257/295 |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,808,038 | B2 | 10/2010 | Mokhlesi et al. |
| 7,846,782 | B2 | 12/2010 | Maxwell et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,932 | B2 | 5/2012 | Nguyen et al. |
| 8,187,936 | B2 | 5/2012 | Alsmeier et al. |
| 8,394,716 | B2 | 3/2013 | Hwang et al. |
| 8,427,859 | B2 | 4/2013 | Sandhu et al. |
| 8,520,425 | B2 | 8/2013 | Xiao et al. |
| 8,823,076 | B2 | 9/2014 | Lee et al. |
| 8,853,765 | B2 | 10/2014 | Lee et al. |
| 8,981,457 | B2 | 3/2015 | Lee et al. |
| 2003/0062574 | A1 | 4/2003 | Hsieh |
| 2007/0051994 | A1 | 3/2007 | Song et al. |
| 2007/0132049 | A1* | 6/2007 | Stipe ................... G11C 13/0007 257/421 |
| 2007/0210338 | A1 | 9/2007 | Orlowski |
| 2007/0252201 | A1 | 11/2007 | Kito et al. |
| 2009/0001344 | A1 | 1/2009 | Schricker et al. |
| 2009/0230449 | A1 | 9/2009 | Sakaguchi et al. |
| 2010/0013049 | A1 | 1/2010 | Tanaka et al. |
| 2010/0044778 | A1 | 2/2010 | Seol |
| 2010/0046273 | A1* | 2/2010 | Azuma ............... G11C 13/0007 365/148 |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0254191 | A1 | 10/2010 | Son et al. |
| 2010/0320528 | A1 | 12/2010 | Jeong et al. |
| 2011/0031546 | A1 | 2/2011 | Uenaka et al. |
| 2011/0076819 | A1 | 3/2011 | Kim et al. |
| 2011/0122676 | A1 | 5/2011 | Murooka et al. |
| 2011/0133606 | A1 | 6/2011 | Yoshida et al. |
| 2011/0169071 | A1 | 7/2011 | Uenaka |
| 2011/0266606 | A1 | 11/2011 | Park et al. |
| 2012/0001247 | A1 | 1/2012 | Alsmeier |
| 2012/0001249 | A1 | 1/2012 | Alsmeier |
| 2012/0001250 | A1 | 1/2012 | Alsmeier |
| 2012/0025164 | A1* | 2/2012 | Deweerd ............. G11C 13/0004 257/5 |
| 2012/0147648 | A1 | 6/2012 | Scheuerlein |
| 2012/0147649 | A1 | 6/2012 | Samachisa et al. |
| 2012/0217461 | A1* | 8/2012 | Kobayashi ............. H01L 45/08 257/2 |
| 2012/0299063 | A1* | 11/2012 | Baba ................... H01L 45/06 257/208 |
| 2013/0043455 | A1 | 2/2013 | Bateman |
| 2013/0082228 | A1* | 4/2013 | Parrillo ................... H01L 45/08 257/4 |
| 2013/0153852 | A1* | 6/2013 | Park ....................... H01L 45/04 257/4 |
| 2013/0161583 | A1* | 6/2013 | Blomme ................. H01L 45/12 257/5 |
| 2013/0214236 | A1* | 8/2013 | Lu ........................... H01L 45/08 257/4 |
| 2013/0264631 | A1 | 10/2013 | Alsmeier et al. |
| 2013/0313627 | A1 | 11/2013 | Lee et al. |
| 2014/0160830 | A1* | 6/2014 | Chung ............... G11C 13/0004 365/96 |
| 2014/0284543 | A1* | 9/2014 | Ishikawa ............. H01L 45/148 257/4 |
| 2015/0069318 | A1* | 3/2015 | Arayashiki ........... H01L 45/085 257/4 |
| 2015/0179255 | A1* | 6/2015 | Sarpatwari ......... G11C 13/0038 365/148 |
| 2015/0179800 | A1* | 6/2015 | Biswas ............... H01L 29/7855 365/189.011 |

FOREIGN PATENT DOCUMENTS

| | | |
|---|---|---|
| KR | 2011-0021444 A | 3/2011 |
| WO | WO 02-15277 A2 | 2/2002 |
| WO | WO 2007/004843 A1 | 1/2007 |

OTHER PUBLICATIONS

International Search Report & Written Opinion, PCT/US2011/042566, Jan. 17, 2012 (30 pp.).
Invitation to Pay Additional Fees & Partial International Search Report, PCT/US2011/042566, Sep. 28, 2011. (7 pp.).
Endoh, T.et al., titled "Novel Ultra High Density Memory With a Stacked-Surrounding Gate Transistor (S-SGT) Structured Cell", IEDM Proc. (2001) 33-36.
Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Kimura, Masahide "3D Cells Make Terabit NAND Flash Possible," Nikkei Electronics Asia, Sep. 17, 2009, 6pgs.
Maeda et al., "Multi-Stacked 1G Cell/Layer Pipe-Shaped BiCS Flash Memory," 2009 Symposium on VLSI Technology Digest of Technical Papers, pp. 22-23.
Tanaka et al., "Bit-Cost Scalable Technology for Low-Cost and Ultrahigh-Density Flash Memory," Toshiba Review, vol. 63, No. 2, 2008, pp. 28-31.
U.S. Appl. No. 14/136,103, filed Dec. 20, 2013, Takaki.
U.S. Appl. No. 14/150,162, filed Jan. 8, 2014, Takaki et al.
U.S. Appl. No. 14/206,196, filed Mar. 12, 2014, Takaki.
U.S. Appl. No. 14/224,290, filed Mar. 25, 2014, Takaki.
U.S. Appl. No. 14/463,113, filed Aug. 19, 2014, Takaki.
U.S. Appl. No. 14/614,709, filed Feb. 5, 2015, Takaki.
U.S. Appl. No. 14/643,211, filed Mar. 10, 2015, Tobitsuka.
U.S. Appl. No. 14/468,644, filed Aug. 26, 2014, Izumi et al.
U.S. Appl. No. 14/468,744, filed Aug. 26, 2014, Izumi et al.
Demami, F. et al., "Electrical Properties of Polysilicon Nanowires for Devices Applications," Physica Status Solidi C 8, Vo. 3, pp. 1-4, (2011).
Invitation to Pay Additional Fees or PCT/US2015/062780, dated Mar. 7, 2016, 7 pages.

(56) References Cited

OTHER PUBLICATIONS

International Search Report and Written Opinion of the International Searching Authority for PCT/US2015/062780, dated May 10, 2016, 18 pages.

* cited by examiner

PARALLEL BIT LINE THREE-DIMENSIONAL RESISTIVE RANDOM ACCESS MEMORY

FIELD

The present disclosure relates generally to the field of semiconductor devices and specifically to three-dimensional non-volatile memory devices, such as a three-dimensional resistive random access memory (ReRAM) devices and other three-dimensional devices, and methods of making the same.

BACKGROUND

Demand for greater computing capabilities especially in mobile computing has created a need for developing new technology for non-volatile memory devices having large memory capacity, high density, and low power consumption. Flash memory devices, while being the most common type of non-volatile memory devices, require relatively high operational voltage to write or erase data. As the gate length a conventional flash memory device scales down to tens of nanometers, adjacent memory cells may be parasitically operated during operation of a single memory cell, thus corrupting the integrity of data stored in memory cells. Such parasitic coupling between adjacent memory cells poses a serious challenge to further scaling of conventional flash memory devices.

Resistance Random Access Memory, or "ReRAM," is a non-volatile memory device employing reversible change in resistance in a thin film with application of electrical voltage bias across the film. Application of the electrical voltage bias in one manner can cause decrease in the resistance of the thin film, for example, by formation of filaments that function as leakage current paths. Application of a different type of electrical voltage bias can cause reversal of the resistance of the thin film to an original high-resistance state by removal of the filaments from the thin film. Thus, data can be stored in a ReRAM cell by changing the resistance of the thin film, which can be a solid-state material. The thin film is referred to as a memristor, a memory film, or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman.

SUMMARY

According to an aspect of the present disclosure, a memory device is provided, which comprises: line stack structures located over a substrate, laterally spaced apart along a first horizontal direction, and extending along a second horizontal direction that is different from the first horizontal direction, each line stack structure comprising an alternating plurality of word lines and bit lines; and a two-dimensional array of vertical selector lines that extend vertically, are laterally spaced from a neighboring line stack structure by a respective gate dielectric, and are spaced apart along the first horizontal direction and along the second horizontal direction. A memory material line structure is located between each vertically neighboring pair of a word line and a bit line within the alternating plurality of word lines and bit lines. Each memory material line structure comprises a material having at least two states having different bulk resistivity.

According to another embodiment of the present disclosure, a method of forming a memory device is provided. A layer stack is formed over a substrate. The layer stack comprises an alternating plurality of first conductive material layers and second conductive material layers. A memory material layer is present within each vertically neighboring pair of a first conductive material layer and a second conductive material layer. Line stack structures are formed by patterning the layer stack. The line stack structures are laterally spaced apart along a first horizontal direction, and extend along a second horizontal direction that is different from the first horizontal direction. Each line stack structure comprises an alternating plurality of word lines and bit lines. Gate dielectrics are formed on sidewalls of the line stack structures. A two-dimensional array of vertical selector lines is formed on the gate dielectrics. The vertical selector lines extend vertically, are laterally spaced from a neighboring line stack structure by a respective gate dielectric, and are spaced apart along the first horizontal direction and along the second horizontal direction.

According to yet another aspect of the present disclosure, a method of operating a memory device is provided. The memory device comprises line stack structures located over a substrate, laterally spaced apart along a first horizontal direction, and extending along a second horizontal direction that is different from the first horizontal direction, each line stack structure comprising an alternating plurality of word lines and bit lines; and a two-dimensional array of vertical selector lines that extend vertically, are laterally spaced from a neighboring line stack structure by a respective gate dielectric, and are spaced apart along the first horizontal direction and along the second horizontal direction. A memory material line structure is located between each vertically neighboring pair of a word line and a bit line within the alternating plurality of word lines and bit lines. Each surface portion of the intrinsic semiconductor line structures that is located adjacent to a vertical selector line defines a vertical semiconductor channel. A selected vertical semiconductor channel can be turned on by: applying a select gate voltage to a vertical selector line that contacts a gate dielectric in contact with the selected vertical semiconductor channel; applying a first voltage to all word lines and bit lines located above the selected vertical semiconductor channel; and applying a second voltage to all word lines and bit lines located below the selected vertical semiconductor channel.

According to still another aspect of the present disclosure, a resistive random access memory transistor device is provided, which comprises a semiconductor channel, a memory material portion contacting the semiconductor channel, a doped semiconductor material region contacting the semiconductor channel and spaced from the memory material portion; a gate dielectric located on the semiconductor channel, a gate conductor located on the gate dielectric, a first conductive structure contacting the memory material portion, and a second conductive structure contacting the doped semiconductor material region.

DETAILED DESCRIPTION

As discussed above, the present disclosure is directed to a three-dimensional resistive random access memory (ReRAM) devices and other three-dimensional devices, and methods of making the same, the various aspects of which are described below. The embodiments of the disclosure can be employed to form various semiconductor devices such as three-dimensional monolithic memory array devices comprising ReRAM devices. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

Figure 1:
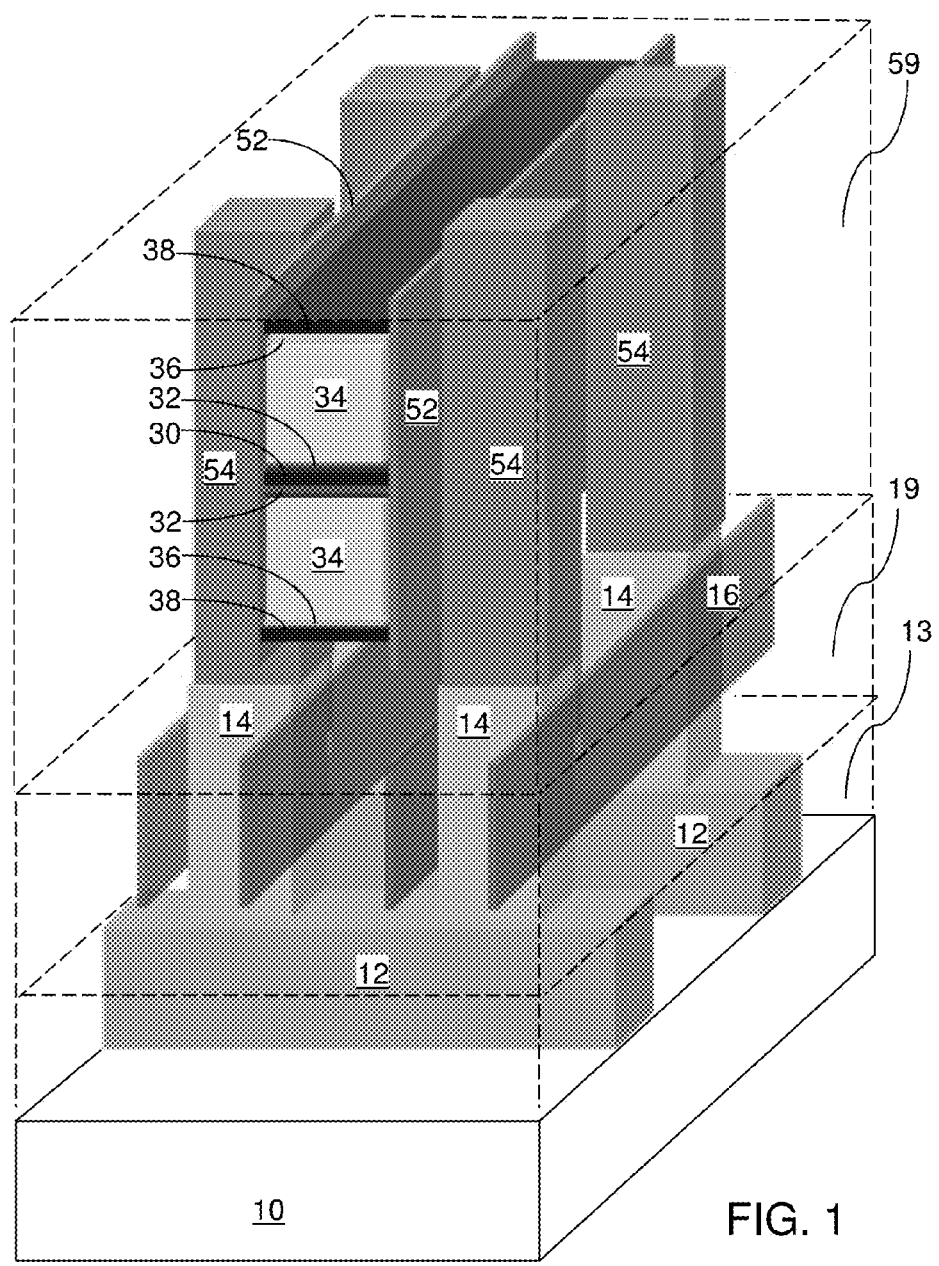
FIG. 1 is a perspective assembly view of an exemplary structure according to an embodiment of the present disclosure.
Figure 2:
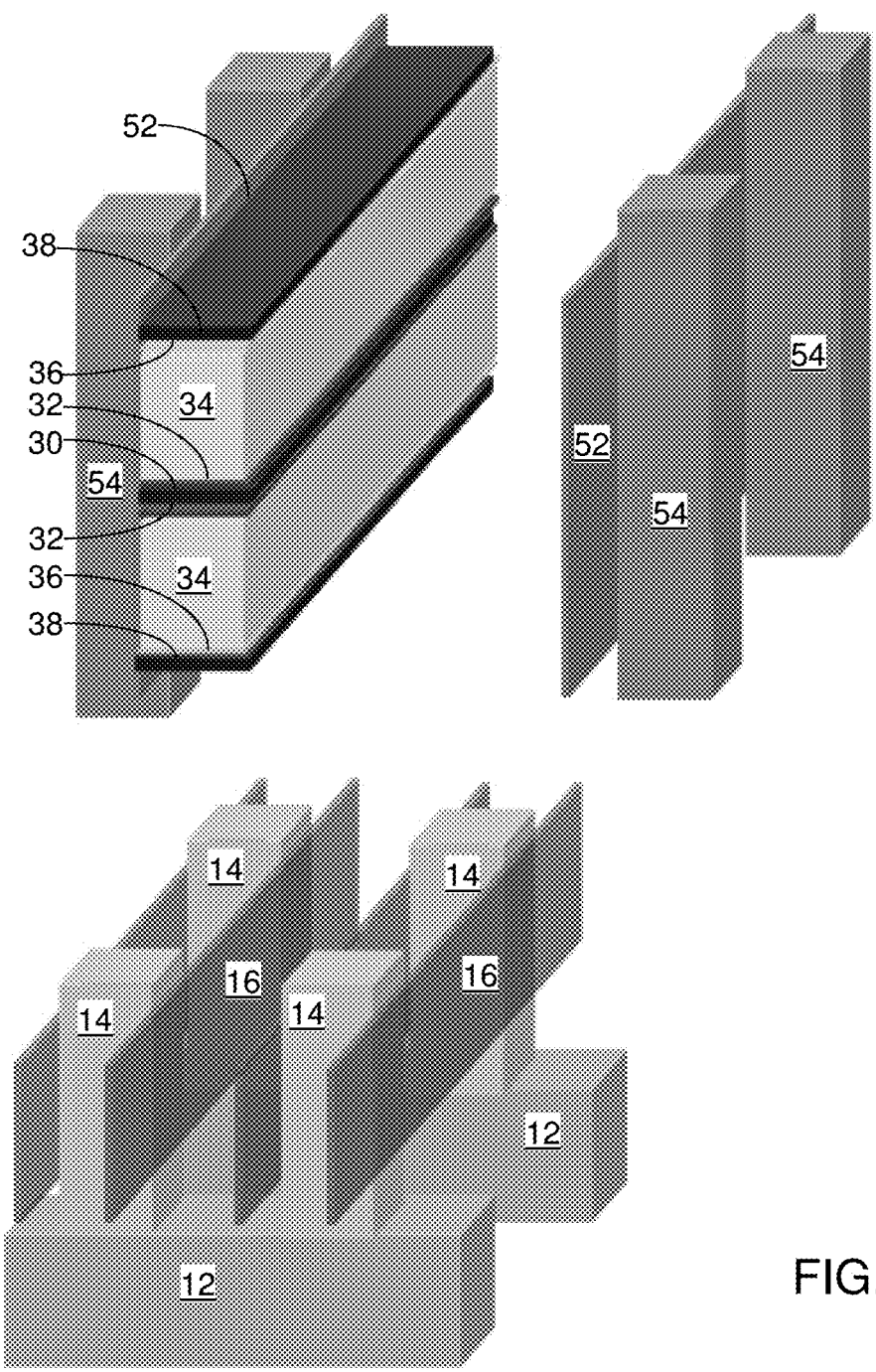
FIG. 2 is a perspective exploded view of the exemplary structure according to an embodiment of the present disclosure.

The various three dimensional memory devices of the present disclosure can include a ReRAM device, and can be fabricated employing the various embodiments described herein. FIG. 1 shows a region of an exemplary structure in a perspective assembly view. FIG. 2 shows the region of the exemplary structure in a perspective exploded view. The exemplary structure can be a memory device such as a resistive random access memory (ReRAM) device.

Figure 3:
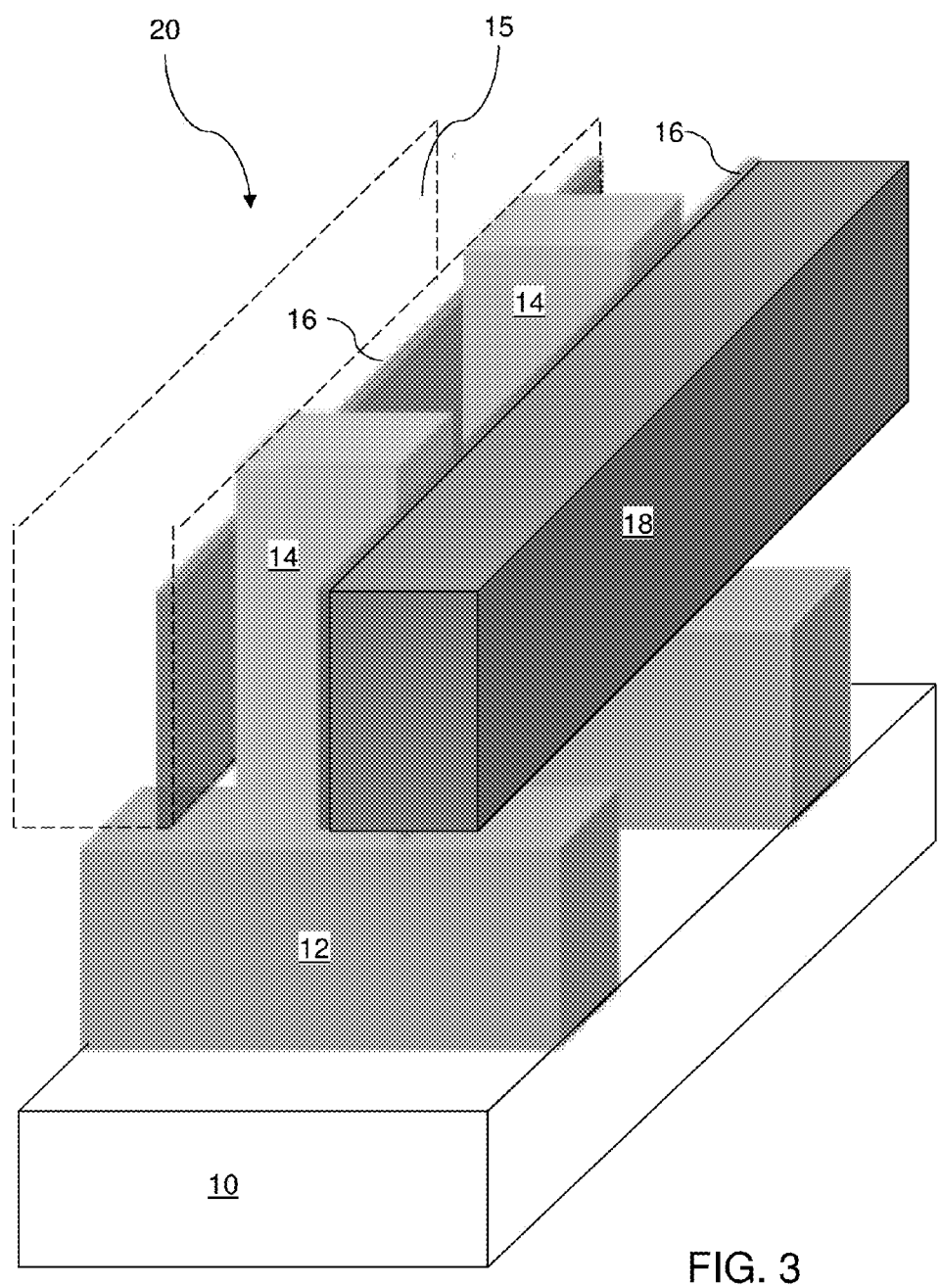
FIG. 3 is a perspective assembly view of a vertical access transistor module of the exemplary structure according to an embodiment of the present disclosure.
Figure 4:
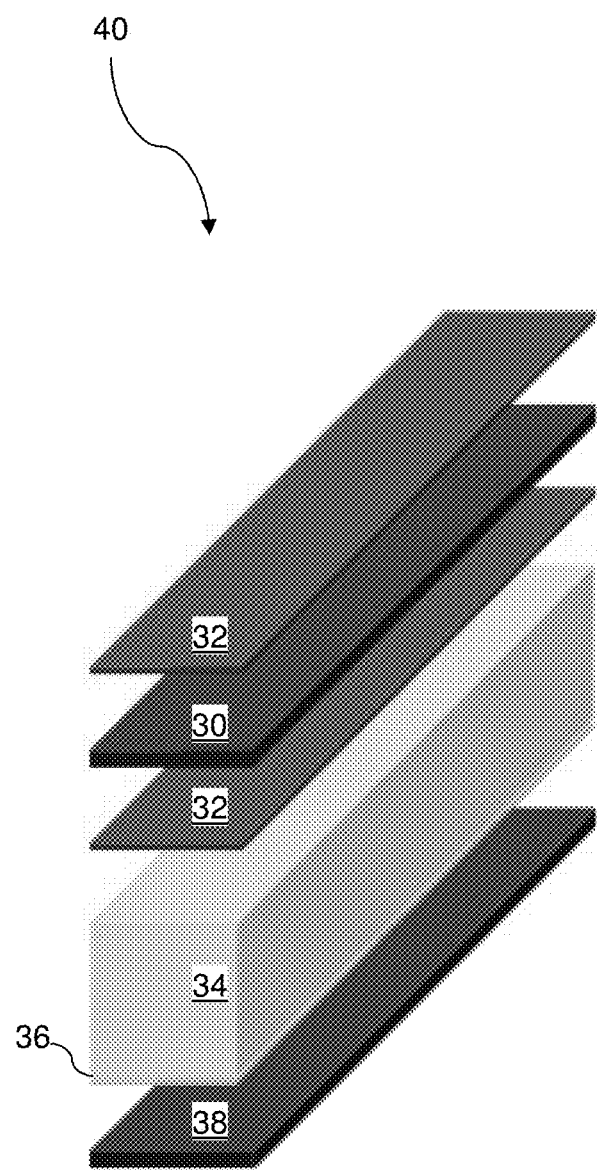
FIG. 4 is a perspective exploded view of a portion of a line stack structure of the exemplary structure according to an embodiment of the present disclosure.

The exemplary structure can comprise a vertical access transistor module, a plurality of line stack structures, and vertical selector lines and selector gate dielectrics. A region of the vertical access transistor module is illustrated in FIG. 3 in a perspective assembly view. A region of a line stack structure is illustrated in FIG. 4 in a perspective exploded view. A region of the vertical selector lines and a selector gate dielectric are illustrated in a perspective assembly view in FIG. 5.

Referring to FIGS. 1, 2, 3, and 6, the exemplary structure comprises a vertical access transistor module 20, which can be formed on a substrate 10. The topmost portion of the substrate 10 comprises an insulating material. Another portion of the substrate 10 may optionally underlie the insulating material of the substrate 10. The substrate 10 may consist of a dielectric material portion including the dielectric material, or can further comprise at least one underlying material layer. The underlying material layer can be a semiconductor layer, a conductive layer, or a dielectric layer. In one embodiment, the substrate 10 can comprise a semiconductor substrate such as a silicon substrate, and an insulating material portion can be provided at a top surface of the semiconductor substrate.

As used herein, a "semiconductor substrate" refers to a substrate that includes at least one semiconductor material portion, i.e., at least one portion of a semiconductor material. As used herein, a "semiconductor material" refers to a material having electrical conductivity in the range from $1.0 \times 10^{-6}$ S/cm to $1.0 \times 10^5$ S/cm, and is capable of producing a doped material having electrical resistivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. All measurements for electrical conductivities are made at the standard condition.

Figure 6:
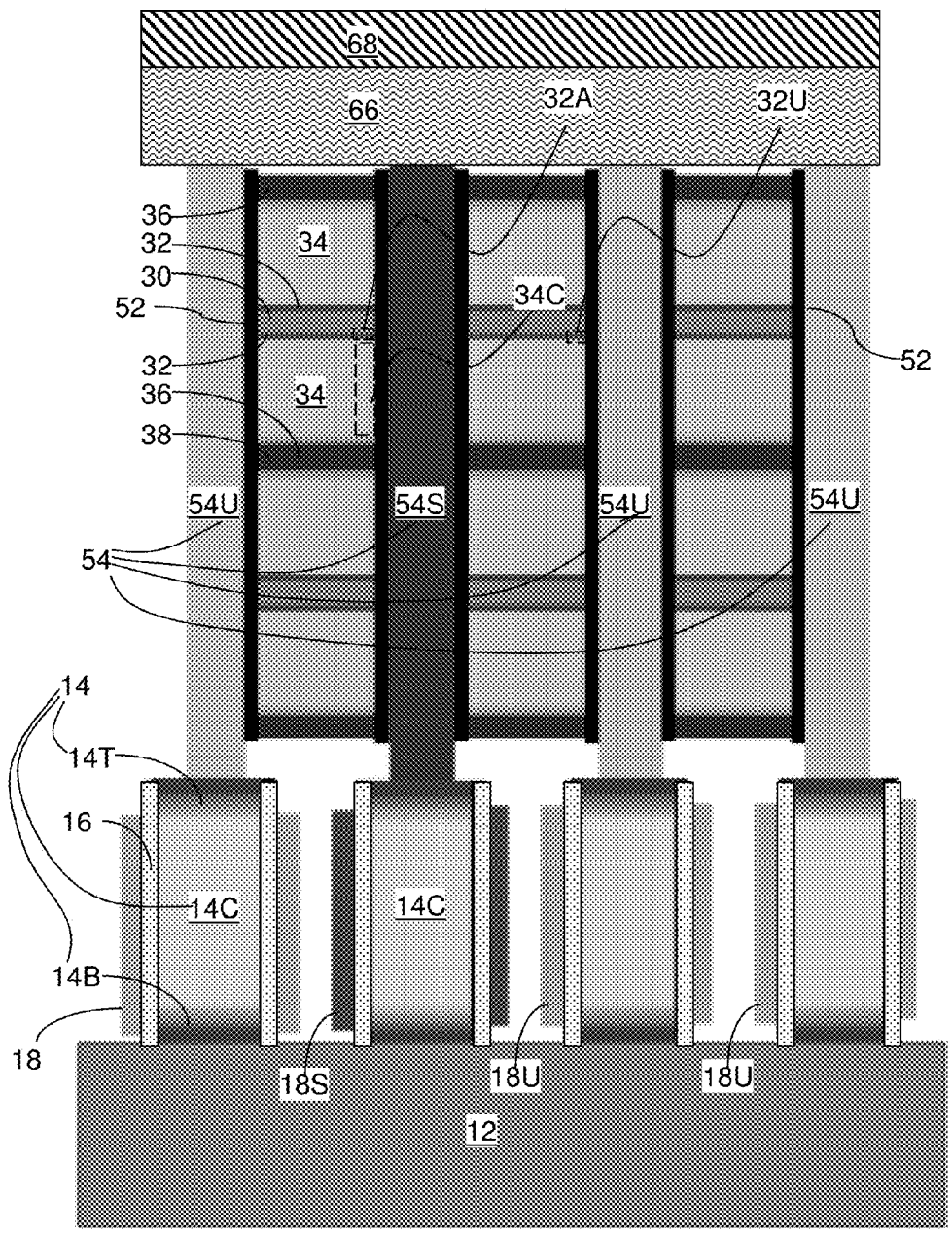
FIG. 6 is a vertical cross-sectional view of the exemplary structure along a vertical direction perpendicular to the lengthwise direction of the line stack structures according to an embodiment of the present disclosure.

A one-one dimensional array of conductive lines can be formed over the substrate 10. The one-dimensional array of conductive lines can have a uniform width, and can be laterally spaced from one another by a spacing, which can be determined based on the pitch of memory structures to be subsequently formed above the vertical access transistor module 20. The one-dimensional array of conductive lines is herein referred to as horizontal selector lines 12, which extend horizontally along a first direction (which is herein referred to as a first horizontal direction), and can be employed to activate a vertical selector line 54 that is selected from a two-dimensional array of vertical selector lines 54. Each horizontal selector line 12 is connected to a plurality vertical selector lines 54 through a plurality of selector transistors, each of which includes an active semiconductor region 14 (which can include, for example, a bottom doped region 14B, a top doped region 14T, and a channel portion 14C as illustrated in FIG. 6), a portion of a selector gate dielectric 16, and a portion of a selector gate electrode line 18. Activation of a selected vertical selector line 54 from among the set of vertical selector lines attached to a selected horizontal selector line 12 can be effected by turning on a selector transistor including an active semiconductor region 14 that is adjoined to the selected horizontal selector line 12 and the selected vertical selector line 54, respectively. One of a top doped region 14T and a bottom doped region 14B can be a source region, and the other of the top doped region 14T and the bottom doped region 14B can be a drain region. The channel portion 14C can have a doping of the opposite conductivity type of the top doped region 14T and the bottom doped region 14B.

The one-dimensional array of horizontal selector lines 12 can be formed, for example, by deposition and patterning of a conductive material layer. The horizontal selector lines 12 comprise a conductive material such as tungsten, aluminum, copper, titanium, ruthenium, or a combination thereof. A metallic liner including a conductive metallic nitride, such as TiN, TaN, and WN, can be optionally employed to promote adhesion of the metallic material to the insulating material underneath. The height of the horizontal selector lines 12 can be in a range from 30 nm to 300 nm, although lesser and greater thicknesses can also be employed. A selector-line-level dielectric layer 13, or a first dielectric layer, can be subsequently deposited on the horizontal selector lines 12. The selector-line-level dielectric layer 13 comprises a dielectric material such as silicon oxide, silicon nitride, or a combination thereof. The top surface of the selector-line-level dielectric layer 13 can be planarized so that the top surface of the selector-line-level dielectric layer 13 is coplanar with the top surfaces of the horizontal selector lines 12.

Each selector transistor (14, 16, 18) can be formed on top of a portion of a horizontal selector line 12. A semiconductor material stack including a bottom doped semiconductor material layer, a channel level semiconductor material layer, and a top doped semiconductor layer can be formed by sequential deposition of semiconductor materials. The bottom doped semiconductor material layer can have the same doping as the bottom doped regions 14B to be subsequently patterned. The channel level semiconductor material layer has the same doping as the channel portions 14C to be subsequently patterned. The top doped semiconductor layer has the same doping as the top doped regions 14T to be subsequently patterned. The semiconductor material stack includes amorphous semiconductor materials and/or polycrystalline semiconductor materials. Each layer within the semiconductor material stack can be formed, for example, by chemical vapor deposition.

The semiconductor material stack is subsequently patterned to form an array of active semiconductor regions 14, each of which can be formed on portions of top surfaces of the horizontal selector lines 12. In one embodiment, the active semiconductor regions 14 can be formed as a rectangular array. In one embodiment, the entire area of each active semiconductor region 14 can be within the areas of the horizontal selector lines 12.

The semiconductor material of each active semiconductor region 14 can be an elemental semiconductor material such as polysilicon or a silicon-germanium alloy, or can be a compound semiconductor material such as GaAs or InAs. Each active semiconductor region 14 adjoins an underlying horizontal selector line 12.

A selector-transistor-level dielectric layer 19, or a second dielectric layer, can be formed to fill the gaps between the active semiconductor regions 14. The selector-transistor-level dielectric layer 19 comprises a dielectric material such as silicon oxide, silicon nitride, or a combination thereof. The selector-transistor-level dielectric layer 19 can be planarized, for example, employing the top surfaces of the active semiconductor regions 14 as stopping structures. In this case, the top surface of the selector-transistor-level dielectric layer 19 can be coplanar with the top surfaces of the active semiconductor regions 14.

In one embodiment, a selector-transistor-level dielectric layer 19 can be patterned to form line trenches 15 between neighboring pairs of active semiconductor regions 14. The line trenches 15 extend along a second horizontal direction that is different from the first horizontal direction. In one embodiment, the second horizontal direction can be perpendicular to the first horizontal direction. The bottom surfaces of the line trenches 15 do not contact the horizontal selector lines 12, and is vertically spaced from a horizontal plane including the top surfaces of the horizontal selector lines 12 by a separation distance, which can be in a range from 20 nm to 100 nm, although lesser and greater separation distances can also be employed.

In one embodiment, selector gate dielectrics 16 can be formed on at least one the sidewalls of the line trenches 15. Specifically, the selector gate dielectrics 16 can be formed directly on the sidewalls of the channel portions 14C and the top doped regions 14T and the sidewalls of the remaining portions of the selector-line-level dielectric layer 13 (which are located between neighboring pairs of the active semiconductor regions 14 and between the line trenches 15). The selector gate dielectrics 16 can comprise a dielectric material such as a dielectric metal oxide having a dielectric constant greater than 7.9 (e.g., aluminum oxide) and/or silicon oxide and/or silicon nitride. The selector gate dielectrics 16 can be formed by a conformal deposition process such as chemical vapor deposition or atomic layer deposition. Optionally, horizontal portions of the select gate dielectrics 16 can be removed by an anisotropic etch. Alternatively or additionally, at least a portion of the selector gate dielectrics 16 can be formed after subsequent formation of vertically extending cavities through the selector-transistor-level dielectric layer 19.

Subsequently, a selector gate electrode line 18 can be formed within each unfilled portion of the line trenches 15. For example, at least one conductive material can be deposited in the cavity within the line trenches 15, and excess portions of the at least one conductive material can be removed from above a horizontal plane including the top surfaces of the active semiconductor regions 14 and the selector-transistor-level dielectric layer 19 by a planarization process, which can be, for example, chemical mechanical planarization (CMP) or a recess etch. The at least one conductive material can be further recessed below the horizontal plane including the top surfaces of the active semiconductor regions 14 and the selector-transistor-level dielectric layer 19 to form the selector gate electrode lines 18. Optionally, a portion of each selector gate dielectric 16 can be removed from above the top surfaces of the selector gate electrode lines 18.

An array of selector gate electrode lines 18 extending along the second horizontal direction is formed over the horizontal selector lines 12. The selector gate electrode lines 18 comprise a conductive material, which can be a doped semiconductor material (such as doped polysilicon or a doped silicon-germanium alloy) and/or a metallic material (such as tungsten, aluminum, copper, titanium, ruthenium, a metal silicide, a conductive metallic nitride, or a combination thereof). In one embodiment, the selector gate electrode lines 18 can be formed as spacer structures by depositing a conformal conductive material and anisotropically etching horizontal portions of the deposited conformal conductive material.

At least one portion of each active semiconductor region 14 may be doped with electrical dopants (such as p-type dopants or n-type dopants) to enhance conduction through the active semiconductor region 14 in an on-state, and/or to reduce leakage current through the active semiconductor region 14 in an off-state. For example, a bottom doped region 14B can be formed at a bottom portion of each active semiconductor region 14, a top doped region 14T can be formed at a top portion of each active semiconductor region 14, and the portion between the bottom doped region 14B and the top doped region 14T can be a channel portion 14C.

Referring to FIGS. 1, 2, and 3, selector transistors (14, 16, 18) are formed over the substrate 10. The horizontal selector lines 12 extend parallel to a top surface of the substrate 10 along the first horizontal direction. The selector transistors are located between the horizontal selector lines 12 and the two-dimensional array of the vertical selector lines 54 to be subsequently formed. The selector transistors (14, 16, 18) comprise selector gate electrode lines 18 that extend along the second horizontal direction. A node of each selector transistor (14, 16, 18) provides a switched electrical voltage to a respective vertical selector line 54 that is electrically shorted to a top node (e.g., the top doped region 14T) of the respective selector transistor (14, 16, 18), i.e., the node including the topmost region of a active semiconductor region 14. In one embodiment, the vertical selector lines 54 are arranged as a two-dimensional array, and the selector transistors (14, 16, 18) can provide a switched electrical voltage to the two-dimensional array of vertical selector lines 54.

Line stack structures 40 can be subsequently formed above the selector transistors (14, 16, 18). Generally, at least a subset of the selector transistors (14, 16, 18) can be formed underneath a horizontal plane including a bottommost surface of the line stack structures 40. In one embodiment, all of the selector transistors (14, 16, 18) can be formed underneath the horizontal plane including the bottommost surface of the line stack structures 40. Alternately, a first subset of the selector transistors (14, 16, 18) can be formed underneath the horizontal plane including the bottommost surface of the line stack structures 40, and a second subset of the selector transistors (14, 16, 18) can be formed above the line stack structures 40.

Referring to FIGS. 1, 2, and 4, line stack structures 40 are formed over the selector transistors (14, 16, 18) and the selector-transistor-level dielectric layer 19. The line stack structures 40 can be formed, for example, by forming a layer stack over the selector transistors (14, 16, 18) and the selector-transistor-level dielectric layer 19. The line stack structures 40 can be formed as a periodic one-dimensional array of multi-layer rail structures, each having a uniform width throughout.

The layer stack comprises an alternating plurality of first conductive material layers (which are subsequently patterned into word lines 30) and second conductive material layers (which are subsequently patterned into bit lines 38). A set of intervening layers is present within each vertically neighboring pair of a first conductive material layer and a second conductive material layer. Each set of intervening layers comprises a memory material layer (which is subsequently patterned into memory material line structures 32), and optionally an intrinsic semiconductor material layer (which is subsequently patterned into an intrinsic semiconductor material line structure 34), and a doped semiconductor material layer (which is subsequently patterned into a doped semiconductor material line structure 36). As used herein, an "intrinsic semiconductor material" refers to a semiconductor material in which the ratio of the number of p-type charge carriers to the number of n-type charge carriers is in a range between 0.01 and 100.

In one embodiment, the vertical order of material layers within each set of intervening layers located between a vertically neighboring pair of a first conductive material layer and a second conductive material layer is selected such that the memory material layer contacts the first conductive material layer, the doped semiconductor material layer contacts the second conductive material layer, and the intrinsic semiconductor material layer contacts the memory material layer and the doped semiconductor material layer. An exemplary order of a unit sequence of material layers within the layer stack can be, from bottom to top, a second conductive material layer, a doped semiconductor material layer, an intrinsic semiconductor material layer, a memory material layer, a first conductive material layer, a memory material layer, an intrinsic semiconductor material layer, and a doped semiconductor material layer (which can contact a bottom surface of a second conductive material layer of another unit sequence of material layers).

Each of the first and second conductive material layers can comprise a metallic material such as an elemental metal, an alloy of at least two elemental metals, a conductive metallic nitride, a conductive metallic carbide, or a combination thereof. For example, each of the first and second conductive material layers can comprise W, Al, Cu, Ti, Co, Ru, TiN, TaN, WN, or a combination thereof. Each of the first and second conductive material layers can be formed by physical vapor deposition or chemical vapor deposition, and can have a thickness in a range from 3 nm to 60 nm, although lesser and greater thicknesses can also be employed.

Each of the memory material layers comprises a resistive memory material, which is a material having at least two states having different bulk resistivity. For example, the at least two states, i.e., phases, may include a crystalline state having a lower resistivity and an amorphous or microcrystalline state having a higher resistivity. The state of the resistivity memory material can be selected by selecting different modes of programming. For example, the rate of cooling of the resistivity memory material after melting can determine the grain size or the phase of the resistivity memory material, thereby determining the state of the programmed memory material. In an illustrative example, the memory material layers can comprise a material selected from a chalcogenide, a metal oxide material (such as nickel oxide), and a solid electrolyte.

The doped semiconductor material layers comprise a doped semiconductor material, which refers to a semiconductor material in which the ratio of the number of p-type dopants to the number of n-type dopants is less than 0.01 or greater than 100. The doped semiconductor material layers can comprise a doped elemental semiconductor material, a doped compound semiconductor material, or a doped organic semiconductor material.

The intrinsic semiconductor material layers comprise an intrinsic semiconductor material, i.e., a semiconductor material in which the ratio of the number of p-type dopants to the number of n-type dopants is in a range from 0.01 to 100. The intrinsic semiconductor material layers can comprise an intrinsic elemental semiconductor material, an intrinsic compound semiconductor material, or an intrinsic organic semiconductor material.

In an illustrative example, the doped semiconductor layers can comprise n-doped polysilicon, and the intrinsic semiconductor material layers can comprise intrinsic polysilicon.

The line stack structures 40 (in the shape of horizontally spaced rail structures) can be formed by patterning the layer stack into a one-dimensional array of line structures extending along a horizontal direction, which can be, for example, the second horizontal direction or the first horizontal direction. In one embodiment, the direction along which the line stack structures 40 laterally extend can be the second horizontal direction. In this case, the line stack structures 40 can be laterally spaced apart along the first horizontal direction, and can extend along the second horizontal direction that is different from the first horizontal direction. In another embodiment, the direction along which the line stack structures 40 laterally extend can be the first horizontal direction. In this case, the line stack structures 40 can be laterally spaced apart along the second horizontal direction, and can extend along the first horizontal direction that is different from the second horizontal direction. Generally, the direction along which the line stack structures extent may be parallel to the second horizontal direction, perpendicular to the second horizontal direction, or along any horizontal direction that is neither perpendicular or parallel to the second horizontal direction.

Each line stack structure 40 can comprise an alternating plurality of word lines 30 and bit lines 38. Each remaining portion of the first conductive material layer within the line stack structures 40 after the patterning of the layer stack comprises a word line 30. Each remaining portion of the second conductive material layer within the line stack structure 40 after the patterning of the layer stack comprises a bit line 38. An intervening line stack (32, 34, 36) is formed between each vertically neighboring pair of a word line 30 and a bit line 38. Each intervening line stack (32, 34, 26) includes a memory material line structure 32, and optionally an intrinsic semiconductor material line structure 34, and a doped semiconductor material line structure 36. The memory material line structure 32 is a remaining portion of the memory material layer, the intrinsic semiconductor material line structure 34 is a remaining portion of the intrinsic semiconductor material layer, and the doped semiconductor material line structure 36 is a remaining portion of the doped semiconductor material layer.

In one embodiment, the line stack structures 40 are located over a substrate 10, laterally spaced apart along the first horizontal direction, and extend along the second horizontal direction (which is different from the first horizontal direction). Each line stack structure 40 comprises an alternating plurality of word lines 30 and bit lines 38. An intervening line stack (32, 34, 26) includes a memory material line structure 32, an intrinsic semiconductor material line structure 34, and a doped semiconductor material line structure 36 is located between each vertically neighboring pair of a word line 30 and a bit line 38 within the alternating plurality of word lines 30 and bit lines 38.

A gate dielectric 52 is formed on each sidewall of the line stack structures 40. Each gate dielectric 52 can be a portion of a contiguous gate dielectric layer that includes all gate dielectrics 52, or can be one of a plurality of gate dielectrics 52 that are disjoined from one another. The gate dielectrics 52 can include silicon oxide, silicon nitride, a dielectric metal oxide, or a combination thereof. The gate dielectrics 52 can be formed by a conformal deposition process (such as chemical vapor deposition or atomic layer deposition) and/or a thermal or plasma conversion process (such as oxidation or nitridation). The thickness of the gate dielectrics 52 can be in a range from 1 nm to 6 nm, although lesser and greater thicknesses can also be employed. The gate dielectrics 52 can be formed by depositing a dielectric material directly on the sidewalls of the line stack structures 40.

Within each line stack structure 40, at least one word line 30 can contact an overlying memory material line structure 32 and an underlying memory material line structure 32. Within each line stack structure 40, at least one bit line 38 can contact an overlying doped semiconductor material line structure 36 and an underlying doped semiconductor material line structure 36.

In one embodiment, each memory material line structure 32 contacts a horizontal surface of a neighboring word line 30. In one embodiment, each line stack structure 40 can have a uniform width along the first horizontal direction, and the second horizontal direction can be perpendicular to the first horizontal direction. In another embodiment, each line stack structure 40 can have a uniform width along the second horizontal direction, and the first horizontal direction can be perpendicular to the second horizontal direction.

Figure 5:
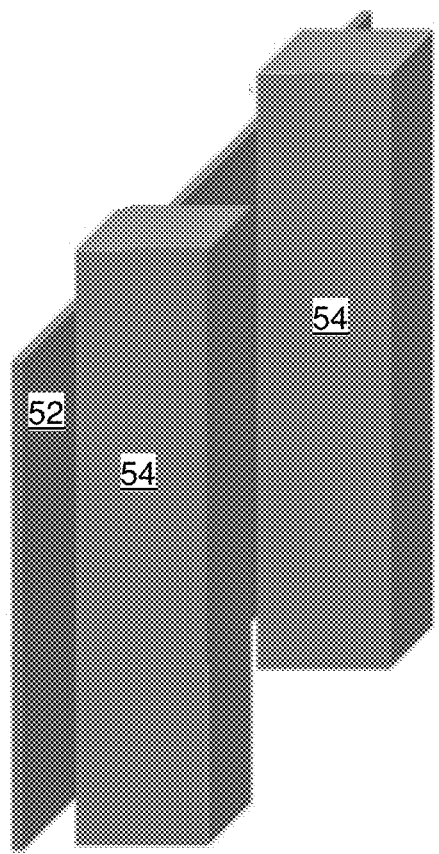
FIG. 5 is a perspective view of vertical selector lines and a selector gate dielectric according to an embodiment of the present disclosure.

Referring to FIGS. 1, 2, and 5, a memory-level dielectric layer 59 (which is a third dielectric layer) and vertical selector lines 54 can be subsequently formed. The memory-level dielectric layer 59 can be formed prior to, or after, formation of the vertical selector lines 54. In case the memory-level dielectric layer 59 is formed first, the memory-level dielectric layer 50 can be deposited in the gaps between the line stack structures 40. The memory-level dielectric layer 59 fills the volumes that are not filled with the line stack structures 40 and the gate dielectrics 52. Excess portions of the memory-level dielectric layer 59 located above the topmost surfaces of the line stack structures 40 can be removed by a planarization process, which can employ, for example, chemical mechanical planarization and/or a recess etch. Gaps among the line stack structures 40 are filled with the memory-level dielectric layer 59.

Vertically extending cavities may be formed through the memory-level dielectric layer 59 in areas that overlie the active semiconductor regions 14. For example, a photoresist layer (not shown) can be applied and lithographically patterned over the memory-level dielectric layer 59 and the array of line stack structures 40 employing a same pattern as the pattern of the horizontal selector lines 12. In one embodiment, the patterned photoresist layer can overlie areas that are the complement of the areas of the horizontal selector lines 12. The combination of the patterned photoresist layer and the line stack structures 40 can be employed as an etch mask during an anisotropic etch process, which etches physically exposed portions of the memory-level dielectric layer 59 to form vertically extending cavities therethrough. Each vertically extending cavity extends to a respective portion of a top surface of a respective active semiconductor region 14. In one embodiment, each line stack structure 40 can overlie a respective selector gate electrode line 18. The sidewalls of the line stack structures 40 are physically exposed on the sidewalls of the vertically extending cavities.

In one embodiment, the vertically extending cavities through the memory-level dielectric layer 59 can be formed as a two-dimensional array. At least one conductive material can be deposited in the vertically extending cavities through the memory-level dielectric layer 59. Exemplary conductive materials that can be deposited into the vertically extending cavities through the memory-level dielectric layer 59 comprise tungsten, aluminum, copper, titanium, ruthenium, or a combination thereof. A metallic liner including a conductive metallic nitride, such as TiN, TaN, and WN, can be optionally employed to promote adhesion of the metallic material to the memory-level dielectric layer 59. Excess portions of the at least one conductive material can be removed from above a horizontal plane including the top surfaces of the line stack structures 40. Remaining portions of the at least one conductive material within the vertically extending cavities through the memory-level dielectric layer 59 constitute vertical selector lines 54. The vertical selector lines 54 can be formed as a two-dimensional array. The two-dimensional array can include vertical selector lines 54 that extend vertically, are laterally spaced from a neighboring line stack structure 40 by a respective gate dielectric 52, and are spaced apart along the first horizontal direction and along the second horizontal direction. Optionally, a dielectric material portion may be added to each gate dielectric 52 by depositing the dielectric material portion directly on the sidewalls of the respective line stack structures 40.

Referring to FIGS. 1, 2, 5, and 9, in one embodiment, in lieu of forming the gate dielectrics on the sidewalls of the line stack structures 40, a memory-level dielectric layer 59 can be deposited to fill the gaps between each neighboring pair of line stack structures 40. After planarizing the memory-level dielectric layer 50 so that the top surface of the memory-level dielectric layer 50 is planar, vertical cavities can be formed in the areas of the active semiconductor regions 14 so that top surfaces of the active semiconductor regions 14 and sidewalls of the line stack structures 40 are physically exposed. A gate dielectric 52 can be formed within each vertical cavity by conformal deposition of a dielectric material and an anisotropic etch. Subsequently, a conductive material is deposited directly on the top surfaces of the active semiconductor regions 14 and sidewalls of the gate dielectrics 52 to form vertical selector lines 54.

Figure 7:
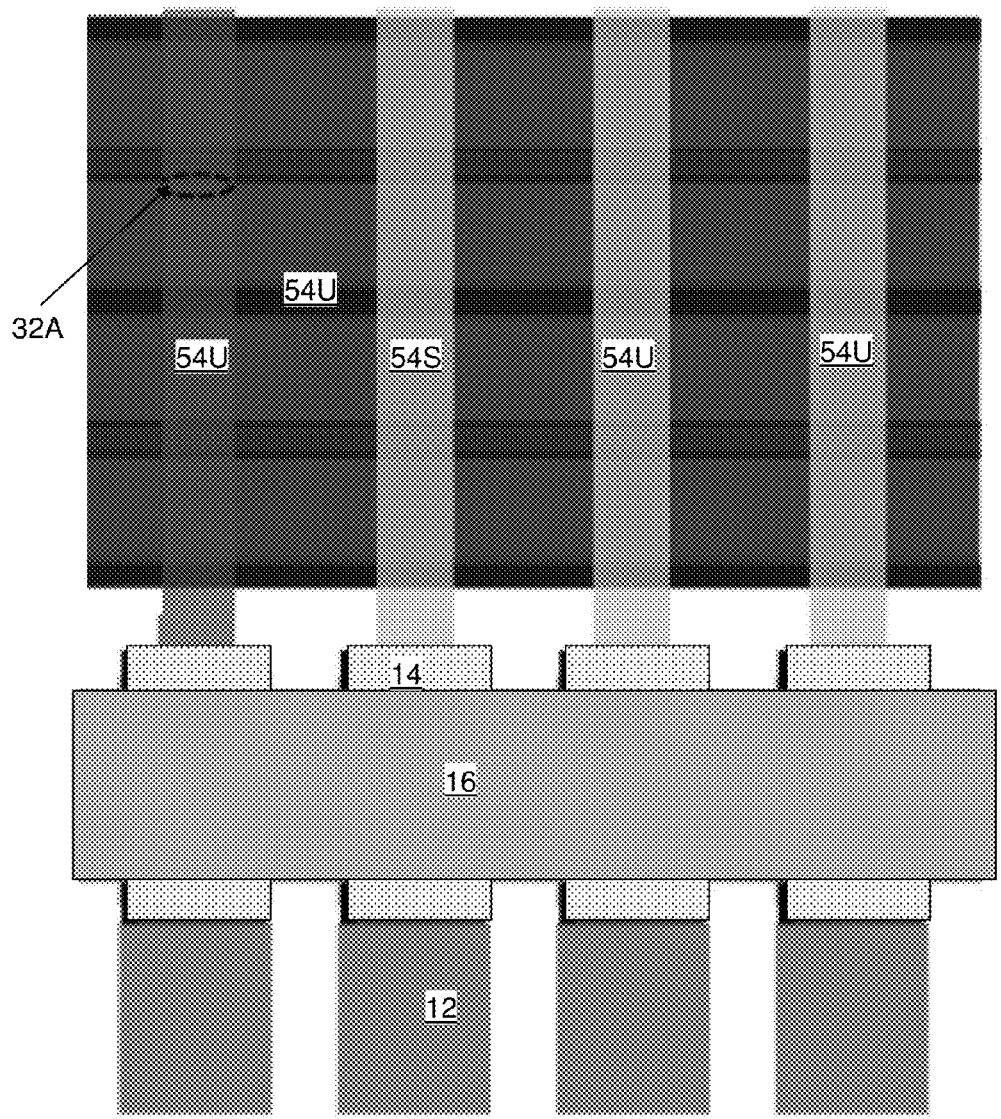
FIG. 7 is a side view of the exemplary structure along a direction parallel to the lengthwise direction of the line stack structures according to an embodiment of the present disclosure.

Referring to FIGS. 1, 6, and 7, each surface portion of the intrinsic semiconductor line structures 34 that is located adjacent to a vertical selector line 54 defines a vertical semiconductor channel 34C. Vertical electrical conduction through each vertical semiconductor channel 34C is controlled by a respective vertical selector line 54.

The exemplary structure can operate as a resistive random access memory (ReRAM) device in which the resistance of each memory element portion (such as the activated memory element 32A) of the memory line structures 40 can be altered to store data. Each memory element (32A, 32U) can be a portion of a memory material line structure 32 that contacts a vertical semiconductor channel 34C. The memory element (32A, 32A) can include an activated memory element 32A (i.e., a selected memory element) and a plurality of unactivated memory elements 32U (i.e., unselected memory elements). The memory material line structures 32 are normally in a highly resistive state to prevent leakage currents therethrough. Thus, a memory element (32A, 32U) can be programmed into a low resistance state only when the memory element (32A, 32U) is programmed into the low resistance state. In other words, the default state of each memory element (32A, 32U) is a high resistance state. Further, the resistivity of the intrinsic semiconductor line structures 34 is high enough to prevent conduction therethrough and enable passage of electrical current through a neighboring memory element contacting the same intrinsic semiconductor line structure 34.

Figure 8:
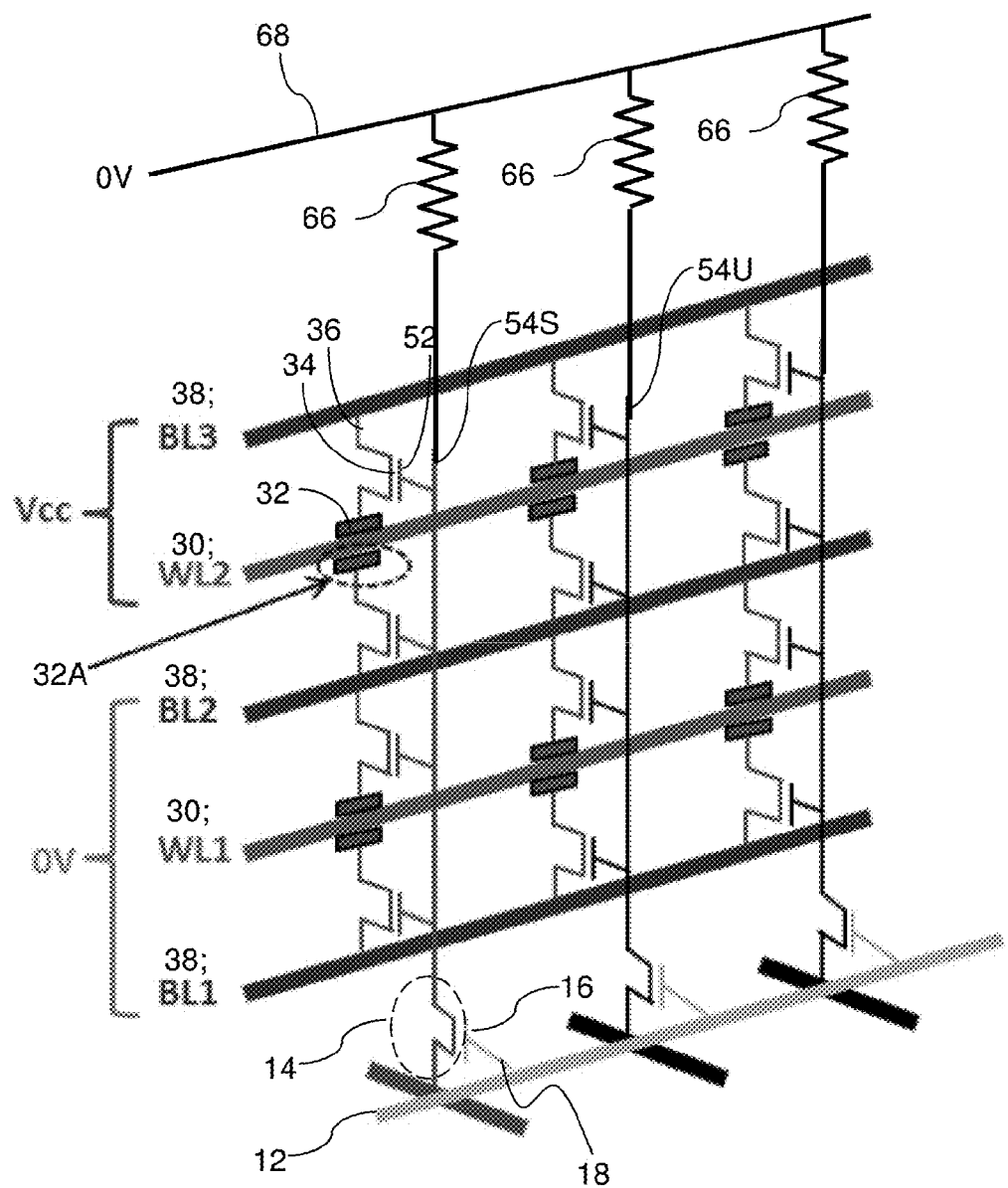
FIG. 8 is a circuit diagram for the exemplary structure according to an embodiment of the present disclosure.

Referring to FIGS. 1, 6, 7, 8, and 11, a vertical semiconductor channel 34C can be selected by activating a selected vertical selector line 54S while activating a set of vertical semiconductor channels 34C located between a selected pair of a word line 30 (such as WL2 in FIG. 8) and a bit line 38 (such as BL2 in FIG. 8). The selected vertical selector line 54S can be activated by turning on a select transistor (14, 16, 18) adjoining the selected vertical selector line 54S. The corresponding select transistor (14, 16, 18) can be turned on by applying a turn-on voltage to the corresponding selector gate electrode line 18S (to the selected selector gate electrode line), while applying a turn-off voltage to all other selector gate electrode lines 18U (i.e., to all other unselected selector gate electrode lines). One of the bottom doped region 14B and the top doped region 14T can function as a source region of the select transistor (14, 16, 18), and the other of the bottom doped region 14B and the top doped region 14T can function as a drain region of the select transistor (14, 16, 18). The channel portion 14C functions as the channel of the select transistor (14, 16, 18). The selected vertical selector line 54S is activated, and all other unselected vertical selector lines 54U are not selected.

Electrical bias can be applied between a selected pair of a word line 30 (such as WL2 in FIG. 8) and a bit line 38 (such as BL2 in FIG. 8). For example, the selected word line 30 (such as WL2 in FIG. 8) and all other word lines 30 and bit lines 38, if any, that are located on the same side of the selected vertical semiconductor channel 34 as the selected word line 30 can be biased at a word-line-side bias voltage (such as a non-zero array power supply voltage Vcc which can be positive or negative). Further, the selected bit line 38 (such as BL2 in FIG. 8) and all other word lines 30 and bit lines 38, if any, that are located on the same side of the selected vertical semiconductor channel 34 as the selected bit line 38 can be biased at a bit-line-side bias voltage (such as 0 V, i.e., the electrical ground voltage).

Among the set of vertical semiconductor channels 34C located between selected pair of a word line 30 (such as WL2 in FIG. 8) and a bit line 38, only the vertical semiconductor channel 34C (i.e., the selected vertical semiconductor channel 34C) that adjoins the selected (i.e., activated) vertical selector line 54S is activated. Thus, a selected vertical semiconductor channel 34C can be turned on by applying a select gate voltage to a vertical selector line 54 that contacts a gate dielectric 52 in contact with the selected vertical semiconductor channel 34, by applying a first voltage to all word lines 30 and bit lines 38 located above the selected vertical semiconductor channel 34C; and by applying a second voltage to all word lines 30 and bit lines 38 located below the selected vertical semiconductor channel 34C. If the selected vertical semiconductor channel 34C contacts a bottom surface of the activated memory element 32A (i.e., the portion of the selected memory material line structure 32 that contacts the selected vertical semiconductor channel 34C), the first voltage can be the word-line-side bias voltage and the second voltage can be the bit-line-side bias voltage. If the selected vertical semiconductor channel 34C contacts a top surface of the activated memory element 32A, the first voltage can be the bit-line-side bias voltage and the second voltage can be the word-line-side bias voltage.

The magnitude of the difference between the word-line-side bias voltage and the bit-line-side bias voltage can be different between a programming mode operation and a sensing mode operation. Generally, the magnitude of the difference between the word-line-side bias voltage and the bit-line-side bias voltage can be greater for the programming mode operation than for the sensing mode operation. In an illustrative example, the magnitude of the difference between the word-line-side bias voltage and the bit-line-side bias voltage can be in a range from 2 V to 10 V for the programming mode operation, and can be in a range from 1 V to 5 V for the sensing mode operation. In one embodiment, word-line-side bias voltage and the bit-line-side bias voltage can be selected in a range from 1 V to 5 V, the selected vertical selector line 54S can be biased at a voltage in a range from 1 V to 3 V, and the unselected vertical selector lines 54U can be biased at a voltage in a range from −3 V to 0 V.

Voltages of the vertical selector lines 54 can be prevented from floating by connecting one end of each vertical selector line 54 to electrical ground through a highly resistive element that has an impedance that is at least one order of magnitude lower (and preferably two or more orders of magnitude lower) than the impedance of an active semiconductor region 14 in an off state, i.e., the impedance of the selector transistor when the vertical selector transistor is turned off. For example, at least one resistor element 66 can be connected to an end of each vertical selector line 54 that is located at the opposite end of the vertical selector line 43 connected to a respective active semiconductor region 14 of a vertical selector transistor. Thus, the unselected vertical selector lines 54U can be at a ground voltage when electrically disconnected from the horizontal selector lines by the selector transistors in the off state. The electrical ground voltage applied to the unselected vertical selector lines 54U ensures that all unselected channels are turned off without significant leakage currents.

The at least one resistor element 66 may be a single layer of a resistive material provided that the resistance of each portion of the at least one resistor element 66 between neighboring pairs of vertical selector lines 54 is high enough, i.e., at least one order of magnitude (and preferably two or more orders of magnitude) higher than the resistance of each vertical selector line 54. For example, an intrinsic polysilicon layer or a lightly doped polysilicon layer (e.g., having a p-type doping or n-type doping at an atomic concentration less than $1.0 \times 10^{16}/cm^3$) can be employed for the single layer of a resistive material for the purpose of at least one resistor element 66 that is shared among the vertical selector lines 54. The thickness of the polysilicon layer may be in a range from 100 nm to 3,000 nm, although lesser and greater thicknesses can also be employed. Electrical grounding of the other end of the at least one resistor element 66 can be effected by an electrical ground bus 68, which can be implemented by a metal layer. Alternatively, the at least one resistor element 66 can be a plurality of resistor elements each having a first end connected to a vertical selector line 54 and a second end contacting the electrical ground bus 68.

Figure 9:
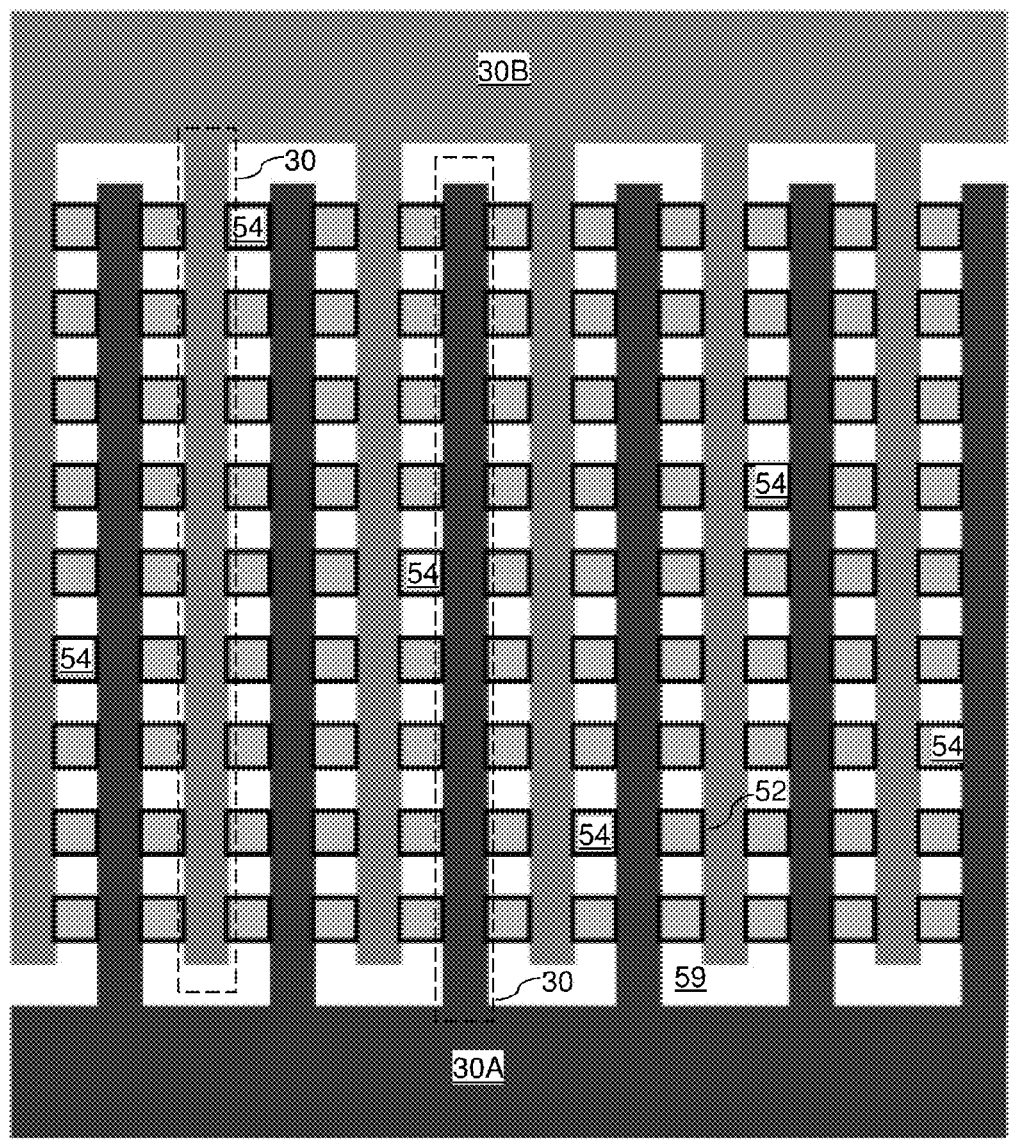
FIG. 9 is a horizontal cross-sectional view of the exemplary structure according to an embodiment of the present disclosure.

Referring to FIGS. 1 and 9, a layout of the word lines 30 of the exemplary structure is illustrated. Each word line 30 located at the same level (at the same horizontal plane) can be structurally integrated as a finger of an integrated multifinger structure (30A or 30B) selected from a first integrated multifinger structure 30A and a second integrated multifinger structure 30B. Each of the first integrated multifinger structure 30A and the second integrated multifinger structure 30B is a word-line-level integrated multifinger structure. The first and second integrated multifinger structures (30A, 30B) can be interdigitated with each other so that fingers of the first integrated multifinger structure 30A are located between fingers of the second integrated multifinger structure 30B. The fingers of the second integrated multifinger structure 30B are located between fingers of the first integrated multifinger structure 30A. The fingers of the first integrated multifinger structure 30A are electrically shorted among one another through an end bar portion of the first integrated multifinger structure 30A. The fingers of the second integrated multifinger structure 30B are electrically shorted among one another through an end bar portion of the second integrated multifinger structure 30B. The first integrated multifinger structure 30A and the second integrated structure 30B can be disjoined from each other. The end bar portions of each integrated multifinger structure (30A, 30B) can extend perpendicular to the lengthwise direction of the memory line structures 40. Each gate dielectric 52 can contact a sidewall of a finger of the first integrated multifinger structure 30A and a sidewall of a finger of the second integrated multifinger structure 30A.

Likewise, each bit line located at the same level can be structurally integrated as a finger of an integrated multifinger structure selected from a first bit-line-level integrated multifinger structure (not shown) and a second bit-line-level integrated multifinger structure (not shown). The first and second bit-line-level integrated multifinger structures can be interdigitated with each other, and disjoined from each other. Each gate dielectric 52 can contact a sidewall of a finger of the first bit-line-level integrated multifinger structure and a sidewall of a finger of the second bit-line-level integrated multifinger structure. In one embodiment, the first and second bit-line-level integrated multifinger structures can have the same horizontal cross-sectional area as the first and second integrated multifinger structures (30A, 30B).

Figure 10:
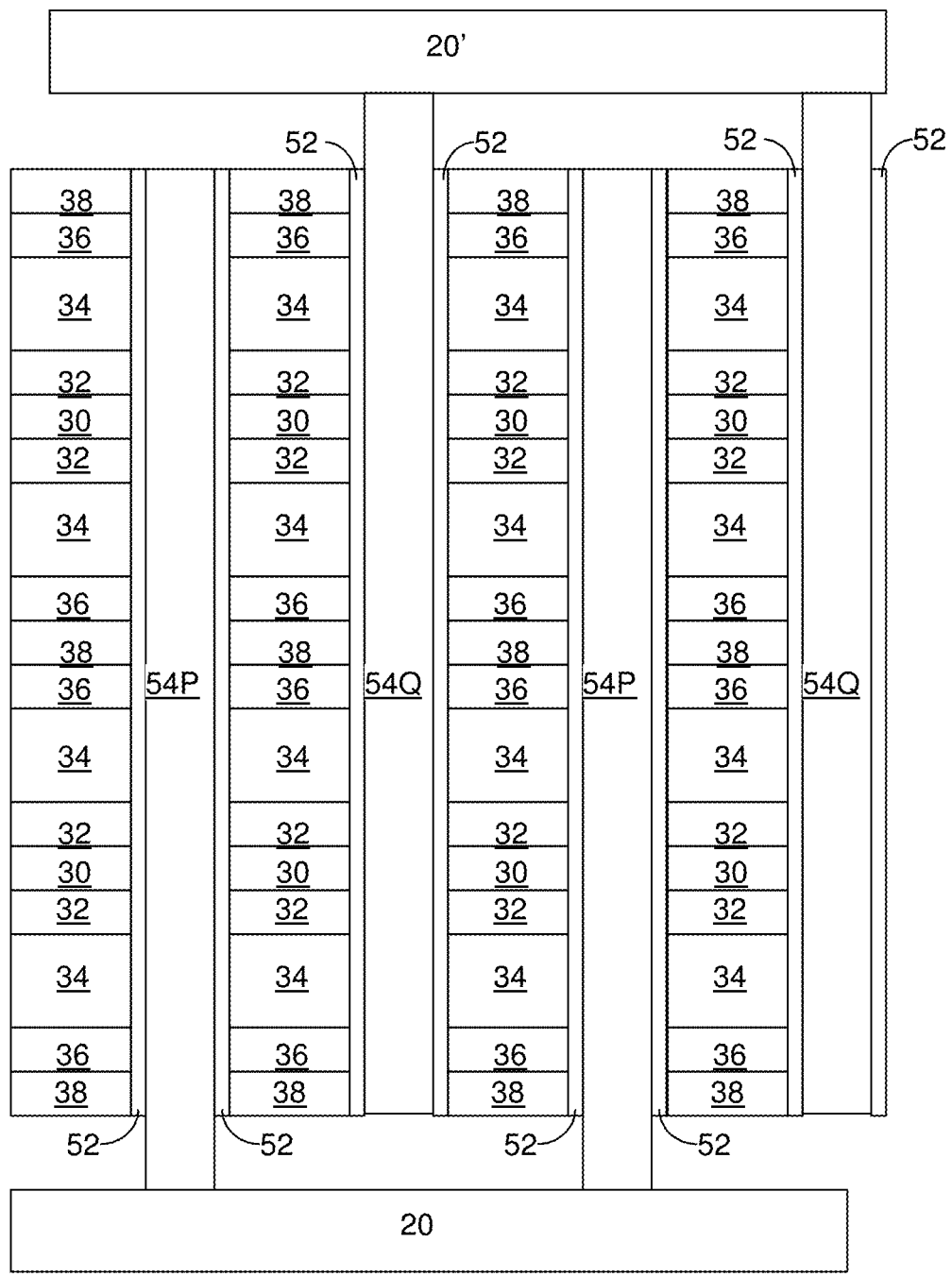
FIG. 10 is a vertical cross-sectional view of an alternate embodiment of the exemplary structure according to an embodiment of the present disclosure.

Referring to FIG. 10, a vertical cross-sectional view of an alternate embodiment of the exemplary structure is shown. In this embodiment, a second vertical access transistor module 20' including vertical access transistors for accessing a subset of the selector transistors can be formed over the array of line stack structures 40. In one embodiment, the vertical access transistor module 20 underlying the array of line stack structures 40 can include a first subset of selector transistors (14, 16, 18) that are connected to a first subset of the vertical selector lines 54P, and the second vertical access transistor module 20' overlying the array of line stack structures 40 can include a second subset of selector transistors that are connected to a second subset of the vertical selector lines 54Q.

Figure 11:
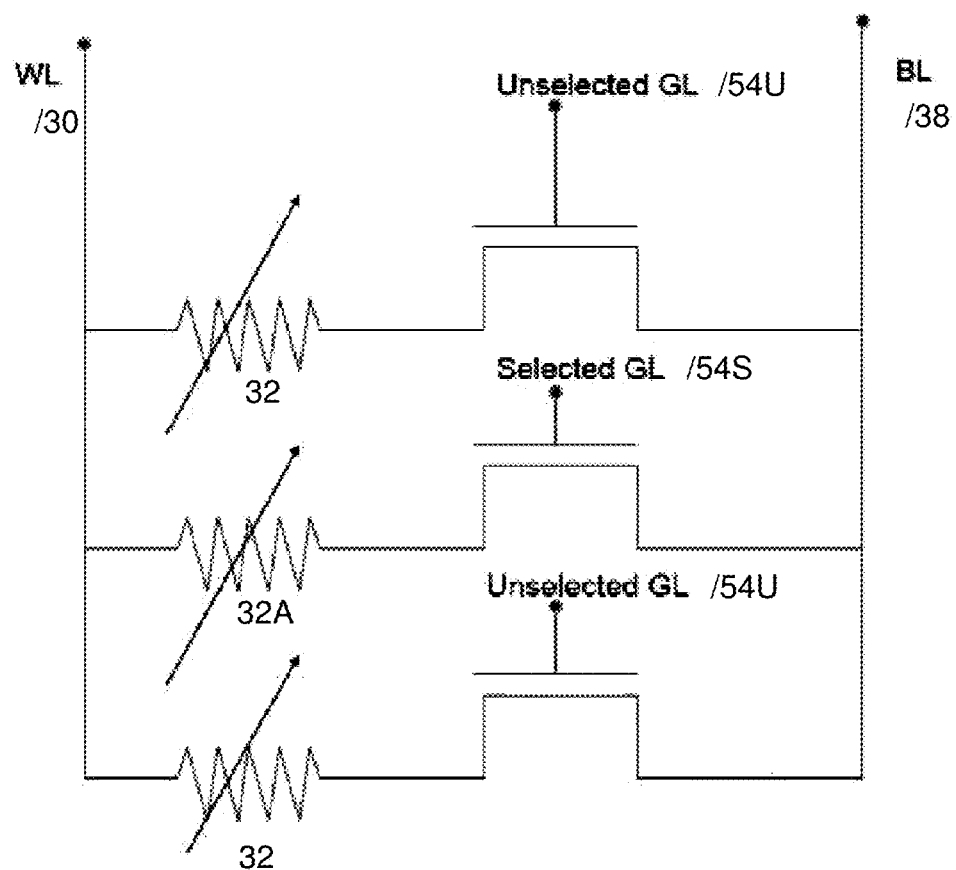
FIG. 11 is a schematic circuit diagram of the resistive memory device of the present disclosure.

In one embodiment, which is best illustrated in FIG. 11, the exemplary structure can include a resistive random access memory transistor device comprising a semiconductor channel 34, such as an intrinsic or low doped semiconductor channel, a memory material portion 32 contacting the semiconductor channel 34, a doped semiconductor material region 36 contacting the semiconductor channel 34 and spaced from the memory material portion 32, a gate dielectric 52 located on the semiconductor channel 34, a gate conductor 54 (e.g., 54S or 54U) located on the gate dielectric 52, a first conductive structure 30 (e.g., word line or another first electrode) contacting the memory material portion 32, and a second conductive structure 38 (e.g., bit line or another second electrode) contacting the doped semiconductor material region 36. In one embodiment, the semiconductor channel 34, the memory material portion 32, the doped semiconductor material region 36, the first conductive structure 30, and the second conductive structure 38 can extend horizontally along a same horizontal direction that is parallel to the top surface of the substrate 10, and can have a same width (uniform width) throughout. In an embodiment, the memory material portion 32 contacts a first end of the semiconductor channel 34, and the doped semiconductor material region 36 comprises one of a source or drain region which contacts a second end of the channel 34 opposite to the first end of the channel. Thus, the resistive random access memory transistor device excludes another one of the source or drain region, since the memory material portion (e.g., a resistivity switching metal oxide or chalcogenide material portion) is located where the another one of the source or drain region would typically be located.

The memory structure of the present disclosure can provide a new architecture in which word lines and bit lines horizontally extend along a same direction within a multi-line rail structure, thereby avoiding the complexity of wiring associated with criss-cross arrangement of conductive lines employed in prior art memory devices. The simplicity of wiring of the memory structure of the present disclosure can thus facilitate scaling of memory devices to smaller dimensions to provide a higher device density.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
   line stack structures located over a substrate, laterally spaced apart along a first horizontal direction, and extending along a second horizontal direction that is different from the first horizontal direction, each line stack structure comprising an alternating plurality of word lines and bit lines; and
   a two-dimensional array of vertical selector lines that extend vertically, are laterally spaced from a neighboring line stack structure by a respective gate dielectric, and are spaced apart along the first horizontal direction and along the second horizontal direction,
   wherein:
   a memory material line structure is located between each vertically neighboring pair of a word line and a bit line within the alternating plurality of word lines and bit lines;
   each memory material line structure comprises a material having at least two states having different bulk resistivity; and
   each of the word lines and the bit lines within any line stack structure selected from the line stack structures continuously extends along the second horizontal direction,
   wherein the memory device comprises at least one feature selected from:
   a first feature that the memory device further comprises selector transistors configured to provide a switched electrical voltage to the two-dimensional array of vertical selector lines, and horizontal selector lines extending parallel to a top surface of the substrate, wherein the selector transistors are located between the horizontal selector lines and the two-dimensional array of the vertical selector lines, each select transistor configured to provide a switched electrical connection between a respective horizontal selector line and a respective vertical selector line, and wherein the horizontal selector lines extend along the first horizontal direction, and the selector transistors comprise selector gate electrode lines that extend along the second horizontal direction;
   a second feature that the memory device further comprises selector transistors configured to provide a switched electrical voltage to the two-dimensional array of vertical selector lines, and horizontal selector lines extending parallel to a top surface of the substrate, wherein the selector transistors are located between the horizontal selector lines and the two-dimensional array of the vertical selector lines, each select transistor configured to provide a switched electrical connection between a respective horizontal selector line and a respective vertical selector line, wherein at least a subset of the selector transistors is located underneath a horizontal plane including a bottommost surface of the line stack structures;
   a third feature that an entire set of word lines and bit lines within each line structure is spatially bounded between a pair of a respective first vertical plane and a respective second vertical plane that extend along the second horizontal direction and laterally spaced apart by a respective uniform width of the line structure along the first direction, the respective uniform width being less than a pitch of the two-dimensional array of vertical selector lines along the first horizontal direction, wherein an entirety of each line structure is spatially bounded between the pair of the respective first vertical plane and the respective second vertical plane, and each word line and each bit line within any line structure includes a respective first vertical sidewall located entirely within the respective first vertical plane and a respective second vertical sidewall located entirely within the respective second vertical plane;
   a fourth feature that an entire set of word lines and bit lines within each line structure is spatially bounded between a pair of a respective first vertical plane and a respective second vertical plane that extend along the second horizontal direction and laterally spaced apart by a respective uniform width of the line structure along the first direction, the respective uniform width being less than a pitch of the two-dimensional array of vertical selector lines along the first horizontal direction, wherein an intervening line stack including the memory material line structure, an intrinsic semiconductor material line structure, and a doped semiconductor material line structure is located between each vertically neighboring pair of a word line and a bit line within the alternating plurality of word lines and bit lines;
   a fifth feature that an entire set of word lines and bit lines within any line structure has a respective uniform width along the first horizontal direction throughout an entirety of the line structure, wherein the entire set of word lines and bit lines within any line structure has a respective same length along the second horizontal direction throughout the entirety of the line structure; and
   a sixth feature that the line stack structures are arranged as a one-dimensional periodic array having a pitch along the first horizontal direction and laterally spaced from one another along the first horizontal direction, wherein a maximum lateral extent of each line stack structure along the first horizontal direction is less than the pitch of the one-dimensional periodic array along the first horizontal direction.

2. The memory device of claim 1, wherein an intervening line stack including the memory material line structure, an intrinsic semiconductor material line structure, and a doped semiconductor material line structure is located between each vertically neighboring pair of a word line and a bit line within the alternating plurality of word lines and bit lines.

3. The memory device of claim 2, wherein:
each surface portion of the intrinsic semiconductor material line structures that is located adjacent to a vertical selector line defines a vertical semiconductor channel; and
vertical electrical conduction through each vertical semiconductor channel is controlled by a respective vertical selector line.

4. The memory device of claim 2, wherein the doped semiconductor material line structures comprise n-doped polysilicon, and the intrinsic semiconductor material line structures comprise intrinsic polysilicon.

5. The memory device of claim 1, wherein each memory material line structure contacts a horizontal surface of a neighboring word line.

6. The memory device of claim 1, wherein at least one word line within each line stack structure contacts an overlying memory material line structure and an underlying memory material line structure.

7. The memory device of claim 1, wherein at least one bit line within each line stack structure contacts an overlying doped semiconductor material line structure and an underlying doped semiconductor material line structure.

8. The memory device of claim 1, wherein the memory device comprises the first feature.

9. The memory device of claim 8, wherein an entirety of each alternating plurality of word lines and bit lines has a uniform width throughout along the first horizontal direction, and the second horizontal direction is perpendicular to the first horizontal direction.

10. The memory device of claim 1, wherein the memory structure comprises the second feature.

11. The memory device of claim 1, wherein:
each word line located at a same level are structurally integrated as a finger of an integrated multifinger structure selected from a first integrated multifinger structure and a second integrated multifinger structure; and
the first integrated multifinger structure and the second integrated structure are disjoined from each other.

12. The memory device of claim 11, wherein each gate dielectric contacts a sidewall of a finger of the first integrated multifinger structure and a sidewall of a finger of the second integrated multifinger structure.

13. The memory device of claim 1, wherein:
each of the memory material line structure comprises a material selected from a chalcogenide, a metal oxide material, and a solid electrolyte; and
the memory structure comprises a resistive random access memory device.

14. The memory device of claim 1, further comprising:
at least one resistor element contacting each of the vertical selector lines; and
an electrical ground bus contacting the at least one resistor element.

15. The memory device of claim 1, wherein each of the word lines and the bit lines within any line stack structure selected from the line stack structures continuously extends along sidewalls of each of a plurality of vertical selector lines that are located along the second horizontal direction and laterally spaced apart from one another along the second horizontal direction.

16. The memory device of claim 1, wherein an entire set of word lines and bit lines within each line structure physically contacts a first sidewall of a respective gate dielectric that physically contacts sidewalls of a respective plurality of vertical selector lines that are spaced apart along the second horizontal direction.

17. The memory device of claim 1, wherein the memory device comprises the third feature.

18. The memory device of claim 1, wherein the memory device comprises the fourth feature.

19. The memory device of claim 18, an entirety of the intervening line stack is spatially bounded between the pair of the respective first vertical plane and the respective second vertical plane.

20. The memory device of claim 19, wherein each word line, each bit line, and each intervening line stack within any line structure includes a respective first vertical sidewall located entirely within the respective first vertical plane and a respective second vertical sidewall located entirely within the respective second vertical plane.

21. The memory device of claim 1, wherein the memory device comprises the fifth feature.

22. The memory device of claim 1, wherein the memory device comprises the sixth feature.

23. A memory device, comprising:
line stack structures located over a substrate, laterally spaced apart along a first horizontal direction, and extending along a second horizontal direction that is different from the first horizontal direction, each line stack structure comprising an alternating plurality of word lines and bit lines; and
a two-dimensional array of vertical selector lines that extend vertically, are laterally spaced from a neighboring line stack structure by a respective gate dielectric, and are spaced apart along the first horizontal direction and along the second horizontal direction,
wherein:
a memory material line structure is located between each vertically neighboring pair of a word line and a bit line within the alternating plurality of word lines and bit lines;
each memory material line structure comprises a material having at least two states having different bulk resistivity;
each of the word lines and the bit lines continuously extends along the second horizontal direction; and
an entirety of each alternating plurality of word lines and bit lines has a uniform width throughout along the first horizontal direction, the uniform width being less than a pitch of the two-dimensional array of vertical selector lines along the first horizontal direction.

24. The memory device of claim 23, wherein each of the word lines and the bit lines continuously extends along the second horizontal direction by a lateral extent that is greater than a maximum lateral extent of the two-dimensional array of vertical selector lines along the second horizontal direction.

25. The memory device of claim 23, wherein an entire set of word lines and bit lines within each line structure is spatially bounded between a pair of a respective first vertical plane and a respective second vertical plane that extend along the second horizontal direction and laterally spaced apart by a respective uniform width of the line structure along the first direction.

26. The memory device of claim 25, wherein an entirety of each line structure is spatially bounded between the pair of the respective first vertical plane and the respective second vertical plane.

27. The memory device of claim 25, wherein each word line and each bit line within any line structure includes a respective first vertical sidewall located entirely within the respective first vertical plane and a respective second vertical sidewall located entirely within the respective second vertical plane.

28. The memory device of claim 25, wherein an intervening line stack including the memory material line structure, an intrinsic semiconductor material line structure, and a doped semiconductor material line structure is located between each vertically neighboring pair of a word line and a bit line within the alternating plurality of word lines and bit lines.

29. The memory device of claim 28, an entirety of the intervening line stack is spatially bounded between the pair of the respective first vertical plane and the respective second vertical plane.

30. The memory device of claim 29, wherein each word line, each bit line, and each intervening line stack within any line structure includes a respective first vertical sidewall located entirely within the respective first vertical plane and a respective second vertical sidewall located entirely within the respective second vertical plane.

31. The memory device of claim 23, wherein an entire set of word lines and bit lines within any line structure has a respective uniform width along the first horizontal direction throughout an entirety of the line structure.

32. The memory device of claim 23, wherein the entire set of word lines and bit lines within any line structure has a respective same length along the second horizontal direction throughout the entirety of the line structure.

33. The memory device of claim 23, wherein the line stack structures are arranged as a one-dimensional periodic array having a pitch along the first horizontal direction and laterally spaced from one another along the first horizontal direction, wherein a maximum lateral extent of each line stack structure along the first horizontal direction is less than the pitch of the one-dimensional periodic array along the first horizontal direction.

34. A memory device, comprising:
line stack structures located over a substrate, laterally spaced apart along a first horizontal direction, and extending along a second horizontal direction that is different from the first horizontal direction, each line stack structure comprising an alternating plurality of word lines and bit lines; and
a two-dimensional array of vertical selector lines that extend vertically, are laterally spaced from a neighboring line stack structure by a respective gate dielectric, and are spaced apart along the first horizontal direction and along the second horizontal direction,
wherein:
a memory material line structure is located between each vertically neighboring pair of a word line and a bit line within the alternating plurality of word lines and bit lines;
each memory material line structure comprises a material having at least two states having different bulk resistivity; and
an entire set of word lines and bit lines within each line structure is spatially bounded between a pair of a respective first vertical plane and a respective second vertical plane that extend along the second horizontal direction and laterally spaced apart by a respective uniform width of the line structure along the first direction, the respective uniform width being less than a pitch of the two-dimensional array of vertical selector lines along the first horizontal direction.

35. The memory device of claim 34, wherein each of the word lines and the bit lines continuously extends along the second horizontal direction by a lateral extent that is greater than a maximum lateral extent of the two-dimensional array of vertical selector lines along the second horizontal direction.

36. The memory device of claim 34, wherein an entirety of each line structure is spatially bounded between the pair of the respective first vertical plane and the respective second vertical plane.

37. The memory device of claim 34, wherein each word line and each bit line within any line structure includes a respective first vertical sidewall located entirely within the respective first vertical plane and a respective second vertical sidewall located entirely within the respective second vertical plane.

38. The memory device of claim 34, wherein an intervening line stack including the memory material line structure, an intrinsic semiconductor material line structure, and a doped semiconductor material line structure is located between each vertically neighboring pair of a word line and a bit line within the alternating plurality of word lines and bit lines.

39. The memory device of claim 38, an entirety of the intervening line stack is spatially bounded between the pair of the respective first vertical plane and the respective second vertical plane.

40. The memory device of claim 39, wherein each word line, each bit line, and each intervening line stack within any line structure includes a respective first vertical sidewall located entirely within the respective first vertical plane and a respective second vertical sidewall located entirely within the respective second vertical plane.

41. The memory device of claim 34, wherein an entire set of word lines and bit lines within any line structure has a respective uniform width along the first horizontal direction throughout an entirety of the line structure.

42. The memory device of claim 34, wherein the entire set of word lines and bit lines within any line structure has a respective same length along the second horizontal direction throughout the entirety of the line structure.

43. The memory device of claim 34, wherein:
each of the word lines and the bit lines continuously extends along the second horizontal direction; and
an entirety of each alternating plurality of word lines and bit lines has a uniform width throughout along the first horizontal direction, and the uniform width is less than a pitch of the two-dimensional array of vertical selector lines along the first horizontal direction.

44. The memory device of claim 34, wherein the line stack structures are arranged as a one-dimensional periodic array having a pitch along the first horizontal direction and laterally spaced from one another along the first horizontal direction, wherein a maximum lateral extent of each line stack structure along the first horizontal direction is less than the pitch of the one-dimensional periodic array along the first horizontal direction.

* * * * *